US012106024B2

(12) United States Patent
Zhang et al.

(10) Patent No.: US 12,106,024 B2
(45) Date of Patent: Oct. 1, 2024

(54) GEOLOGICALLY CONSTRAINED INFRARED IMAGING DETECTION METHOD AND SYSTEM FOR URBAN DEEPLY-BURIED STRIP-LIKE PASSAGE

(71) Applicant: Huazhong University of Science and Technology, Hubei (CN)

(72) Inventors: Tianxu Zhang, Hubei (CN); Yongjun Jia, Hubei (CN); Yuehuan Wang, Hubei (CN); Xiuchang Gu, Hubei (CN); Wenbing Deng, Hubei (CN); Kechao Wang, Hubei (CN); Xin Liu, Hubei (CN)

(73) Assignee: Huazhong University of Science and Technology, Hubei (CN)

( * ) Notice: Subject to any disclaimer, the term of this patent is extended or adjusted under 35 U.S.C. 154(b) by 0 days.

(21) Appl. No.: 18/159,922

(22) Filed: Jan. 26, 2023

(65) Prior Publication Data

US 2023/0237221 A1 Jul. 27, 2023

(30) Foreign Application Priority Data

Jan. 27, 2022 (CN) .......................... 202210098197.1

(51) Int. Cl.
*G06F 30/23* (2020.01)
*G06T 7/70* (2017.01)
(Continued)

(52) U.S. Cl.
CPC ............... *G06F 30/23* (2020.01); *G06T 7/70* (2017.01); *G06T 17/05* (2013.01); *G06V 10/457* (2022.01); *G06T 2207/10048* (2013.01)

(58) Field of Classification Search
CPC . G06F 30/23; G06T 7/70; G06T 17/05; G06T 2207/10048; G06T 17/00;
(Continued)

(56) References Cited

U.S. PATENT DOCUMENTS 9,741,120 B2 *  8/2017  Zhang .................... G06T 5/001
2016/0356920 A1 * 12/2016  Zhang .................... G06V 20/13
2016/0364509 A1 * 12/2016  Zhang .................... G06F 30/20

FOREIGN PATENT DOCUMENTS

CN       114398812 A   *  4/2022
WO   WO-2016106950 A1  *  7/2016  ............. G01V 9/005

OTHER PUBLICATIONS

Fontanilles et al. "Thermal infrared radiance simulation with aggregation modeling (TITAN): an infrared radiative transfer model for heterogeneous three-dimensional surface—application over urban areas," Appl. Opt. 47, 5799-5810 (2008) (Year: 2008).*

(Continued)

*Primary Examiner* — Eunhee Kim
(74) *Attorney, Agent, or Firm* — HSML P. C.

(57) ABSTRACT

Provided in the present invention are a geologically constrained infrared imaging detection method and system for an urban deeply-buried strip-like passage, pertaining to the crossing fields of geophysics and remote sensing technology. The method includes: establishing an urban hierarchical three-dimensional temperature field model according to urban street DEM data and geological data corresponding to urban streets; acquiring urban stratum geological background heat flux according to the urban hierarchical three-dimensional temperature field model; using a total solar radiation energy distribution model to calculate urban surface total solar radiation energy; sequentially filtering out the urban surface total solar radiation energy and the urban stratum geological background heat flux from an infrared remote sensing image of a region corresponding to a strip-like underground target, to acquire a perturbation signal image of an urban street deeply-buried strip-like passage; and using grayscale closed-operation plus an edge detection algorithm to perform detection and positioning after preprocessing the perturbation signal image of the urban street (Continued)

deeply-buried strip-like passage, to acquire location information of an urban strip-like underground passage. The present invention achieves inverse detection and positioning of an urban street deeply-buried strip-like passage.

4 Claims, 3 Drawing Sheets

(51) Int. Cl.
*G06T 17/05* (2011.01)
*G06V 10/44* (2022.01)

(58) Field of Classification Search
CPC ... G06T 2200/08; G06V 10/457; G01J 5/007; G01J 5/06; G01J 2005/0077; G01V 9/005
See application file for complete search history.

(56) References Cited

OTHER PUBLICATIONS

Melillos et al. "Detection of Military Underground Structures through the Remote Sensing Investigation of Phenological Cycle of Crops" published by Advances in Remote Sensing, vol. 7 No. 3, 2018 (Year: 2018).*
K. Wang, X. Liu, W. Deng, H. Liu, T. Zhang and G. Wei, "Underground Tunnel Detection in Mountainous Environment," 2022 International Conference on Artificial Intelligence and Computer Information Technology (AICIT), Yichang, China, 2022, pp. 1-4, doi: 10.1109/AICIT55386.2022.9930295. (Year: 2022).*
Iftimie, Nicoleta, Adriana Savin, Rozina Steigmann, and Gabriel Silviu Dobrescu. "Underground pipeline identification into a non-destructive case study based on ground-penetrating radar imaging." Remote Sensing 13, No. 17 (2021): 3494. (Year: 2021).*

* cited by examiner

GEOLOGICALLY CONSTRAINED INFRARED IMAGING DETECTION METHOD AND SYSTEM FOR URBAN DEEPLY-BURIED STRIP-LIKE PASSAGE

TECHNICAL FIELD

The present invention pertains to the crossing fields of geophysics and remote sensing technology, and more particularly, to a geologically constrained infrared imaging detection method and system for an urban deeply-buried strip-like passage.

BACKGROUND

Currently, according to the domestic and overseas research on methods of using the thermal infrared imaging technology to detect urban underground passage/pipeline targets, an underground target detection method employing multi-temporal infrared images is mostly used. The quantity of data samples of this method is large, and data samples are difficult to acquire. The research object of this method is currently limited to only urban underground pipeline targets and the like that are shallowly buried and have certain characteristics. Therefore, the method is of very limited use. The research object of the underground target detection method employing microwave enhanced infrared imaging technology is shallowly buried underground metal targets. Microwaves pass through the ground layer to act on a metal target buried underground. When irradiated by microwaves, the target generates heat, and then detection is performed by an infrared thermal imaging system. This method is not applicable to detection of non-metallic underground targets. In addition, a microwave emission source is needed, and long-distance large-range passive detection cannot be performed.

Regarding the research on the infrared remote sensing detection method for a deep strip-like underground target in a city, an infrared imaging detection and positioning method for an underground tubular facility in a planar terrain was previously proposed. The method avoids the problem of difficulty in acquiring multi-temporal infrared images. According to a Gaussian model of energy diffusion of an underground tubular facility, an original infrared image of the underground tubular facility modulated by a stratum is subjected to demodulation processing, so as to acquire a target image of the underground tubular facility.

However, the above-described method has the following limitations: 1. Thermal anomaly of an underground pipe is conducted and modulated by a stratum in which the underground pipe is buried, so that a heat distribution reaching the ground is far different from the shape of the underground pipe. Specifically, a thermal diffusion temperature difference decreases dramatically, and a thermal signal is weak. Thermal conduction of the stratum is different in different geographic locations, and accurate calculation of a heat transfer model and heat flux constrained by different geological conditions of the stratum is not taken into consideration. 2. The effect of solar radiation on the urban ground surface receiving is not taken into consideration. 3. The detection of an underground strip-shaped pipeline facility in a planar terrain is still shallow-layer detection. To detect a deep underground strip-like passage/pipeline target, it is necessary to consider stratum heat transfer models for different depths of a city and calculation of urban stratum background heat flux. The current method is not applicable to detection of an urban street deeply-buried strip-like passage.

SUMMARY OF THE INVENTION

For the defects in the prior art, an objective of the present invention is to provide a geologically constrained infrared imaging detection method and system for an urban deeply-buried strip-like passage, aiming to solve the problems in the prior art in which a thermal signal of an urban underground strip-like target in an infrared image is weakened after being conducted and modulated by a stratum, and due to effects of different geological conditions of an urban stratum, an urban strip-like underground passage target cannot be inversely detected and positioned accurately and effectively.

To achieve the above objective, in an aspect, provided in the present invention is a geologically constrained infrared imaging detection method for an urban deeply-buried strip-like passage, comprising the steps of:

(1) establishing an urban hierarchical three-dimensional temperature field model according to urban street DEM data and specific public geological data corresponding to urban streets, wherein the urban hierarchical three-dimensional temperature field model comprises a three-dimensional temperature field model of concrete material covering urban surface roads and a three-dimensional temperature field model of urban street subterranean strata;

(2) calculating urban stratum geological background heat flux according to the urban hierarchical three-dimensional temperature field model, and using a total solar radiation energy distribution model to calculate urban surface total solar radiation energy on the basis of the DEM data;

(3) filtering out the urban surface total solar radiation energy from an infrared remote sensing image of a region corresponding to a strip-like underground target;

(4) filtering out, layer by layer with reference to the DEM data, the urban stratum geological background heat flux from the infrared remote sensing image processed in step (3), to acquire a perturbation signal image of an urban street deeply-buried strip-like passage; and (5) using an inverse detection method to acquire location information of a strip-like underground passage after preprocessing the perturbation signal image of the urban street deeply-buried strip-like passage;

wherein the urban hierarchical three-dimensional temperature field model is constructed on the basis of geometric characteristics of a strip-like underground strip, urban stratum background thermal radiation characteristics, and thermal radiation characteristics of the strip-like underground passage, and the total solar radiation energy distribution model is constructed via distribution of direct solar radiation and distribution of diffuse solar radiation.

Further preferably, a method for preprocessing the perturbation signal image of the urban street deeply-buried strip-like passage comprises the steps of:

a. using, according to temporal and spatial continuity of heat transfer, a rectangular structure element to perform grayscale closed-operation processing on the perturbation signal image for detection, and restoring a discontinuous perturbation signal;

b. performing binarization processing on the perturbation signal image having undergone the grayscale closed-operation processing, and using a canny operator-based edge detection algorithm to acquire edge information of a strip-like passage; and c. filling a connected region in an image acquired via the processing performed in step b, wherein a resultant image acquired after corrosion has been performed in a perpendicular direction is location information for detecting the urban street deeply-buried strip-like passage.

Further preferably, a method for acquiring the distribution of direct solar radiation comprises:
multiplying solar radiation received by an upper boundary of the atmosphere, an atmospheric transmissivity of direct solar radiation, and a sine function of a solar elevation angle, to acquire the distribution of direct solar radiation; and
a method for acquiring the distribution of diffuse solar radiation comprises:
calculating a hemispherical viewshed according to each grid of the DEM data;
dividing the hemispherical viewshed into several sectors with reference to the hemispherical viewshed in combination with the sun position and sky information;
dividing each of the several sectors into several regions, respectively calculating diffuse solar radiation amounts in the several regions, and adding the same to acquire a diffuse solar radiation amount of the entire sector; and
adding the diffuse solar radiation amounts of all of the sectors corresponding to all of the grids to acquire the distribution of diffuse solar radiation.

Further preferably, a method for establishing the urban hierarchical three-dimensional temperature field model comprising the steps of:
constructing an urban underground strip-like target thermal energy radiation hierarchical model by means of COMSOL finite element simulation software, with reference to urban DEM data and the geological data corresponding to the urban streets, and according to heat conservation in a heat transfer process of an urban street/underground strip-like passage coupling model, an underground strip-like passage surface boundary condition, a heat balance equation for a contact surface between an underground strip-like passage outer surface and the urban streets, and a heat conductivity of the underground strip-like passage after introduction of an underground strip-like passage shape factor,
wherein layers of the urban underground strip-like target thermal energy radiation hierarchical model comprise an urban street covering concrete material layer, but does not comprise a stratum of the strip-like underground passage; and
constructing the urban hierarchical three-dimensional temperature field model in correspondence with geological data of different areas and by combining the urban underground strip-like target thermal energy radiation hierarchical model and the DEM data.

In another aspect, provided in the present invention is a geologically constrained infrared imaging detection system for an urban street deeply-buried strip-like passage, comprising:
an urban hierarchical three-dimensional temperature field model establishing module, for establishing an urban hierarchical three-dimensional temperature field model according to urban street DEM data and geological data corresponding to urban streets,
wherein the urban hierarchical three-dimensional temperature field model comprises a three-dimensional temperature field model of concrete material covering urban surface roads and a three-dimensional temperature field model of urban street subterranean strata;
a total solar radiation energy calculating module, for using a total solar radiation energy distribution model to calculate urban surface total solar radiation energy on the basis of the DEM data;
an urban stratum geological background heat flux calculating module, for calculating urban stratum geological background heat flux via the urban hierarchical three-dimensional temperature field model;
an image filtering module, for filtering out the urban surface total solar radiation energy from an infrared remote sensing image of a region corresponding to a strip-like underground target, and filtering out, layer by layer with reference to the DEM data, the urban stratum geological background heat flux from the infrared remote sensing image from which the urban surface total solar radiation energy has been filtered out, so as to acquire a perturbation signal image of an urban street deeply-buried strip-like passage; and
a perturbation signal processing module, for using an inverse detection and positioning method to acquire location information of the strip-like underground passage after preprocessing the perturbation signal image of an urban street deeply-buried strip-like passage;
wherein the urban hierarchical three-dimensional temperature field model is constructed on the basis of geometric characteristics of a strip-like underground strip, urban underground background thermal radiation characteristics, and thermal radiation characteristics of the strip-like underground passage, and the total solar radiation energy distribution model is constructed via distribution of direct solar radiation and distribution of diffuse solar radiation.

Further preferably, the perturbation signal processing module comprises a perturbation signal preprocessing unit and an inverse detection unit,
the perturbation signal preprocessing unit comprises: a grayscale closed-operation processor, an edge detector, and a filling device,
the grayscale closed-operation processor uses, according to temporal and spatial continuity of heat transfer, a rectangular structure element to perform grayscale closed-operation processing on the perturbation signal image for detection, and restores a discontinuous perturbation signal,
the edge detector performs binarization processing on the perturbation signal image having undergone the grayscale closed-operation processing, and uses a canny operator-based edge detection method to acquire edge information of a strip-like passage,
the filling device is used to fill a connected region in an image acquired via the processing performed the edge detector, and
the inverse detection unit is used to perform corrosion in a perpendicular direction of the filled image, and perform inverse detection and positioning on an image acquired by means of the corrosion, and determine location information of a strip-like underground passage.

Further preferably, a method for acquiring the distribution of direct solar radiation comprises:
multiplying solar radiation received by an upper boundary of the atmosphere, an atmospheric transmissivity of direct solar radiation, and a sine function of a solar elevation angle, to acquire the distribution of direct solar radiation; and a method for acquiring the distribution of diffuse solar radiation comprises:

calculating a hemispherical viewshed according to each grid of the DEM data;

dividing the hemispherical viewshed into several sectors with reference to the hemispherical viewshed in combination with the sun position and sky information;

dividing each of the several sectors into several regions, respectively calculating diffuse solar radiation amounts in the several regions, and adding the same to acquire a diffuse solar radiation amount of the entire sector; and adding the diffuse solar radiation amounts of all of the sectors corresponding to all of the grids to acquire the distribution of diffuse solar radiation.

Further preferably, a method for establishing the urban hierarchical three-dimensional temperature field model comprising the steps of:

constructing an urban underground strip-like target thermal energy radiation hierarchical model by means of COMSOL finite element simulation software, with reference to urban DEM data and the geological data corresponding to the urban streets, and according to heat conservation in a heat transfer process of an urban street/underground strip-like passage coupling model, an underground strip-like passage surface boundary condition, a heat balance equation for a contact surface between an underground strip-like passage outer surface and the urban streets, and a heat conductivity of the underground strip-like passage after introduction of an underground strip-like passage shape factor, wherein layers of the urban underground strip-like target thermal energy radiation hierarchical model comprise an urban street covering concrete material layer, but does not comprise a stratum of the strip-like underground passage; and constructing the urban hierarchical three-dimensional temperature field model in correspondence with geological data of different areas and by combining the urban underground strip-like target thermal energy radiation hierarchical model and the DEM data.

In general, compared with the prior art, the above technical solutions proposed in the present invention have the following beneficial effects:

In the present invention, the model of thermal radiation between a stratum in which an urban street deeply-buried strip-like passage is located and an air layer is used in conjunction with DEM data and different geological conditions of the stratum below an urban street, to calculate total solar radiation energy of the urban street surface, and iteratively filter out heat flux of the geological background below the urban stratum layer by layer. A strip-like passage heat propagation energy perturbation signal is acquired. The effects of an external environment and internal geological conditions on the urban stratum, such as disturbance differences in infrared data caused by geological factors such as temperature distribution in layers of different thicknesses in a city, stratum heat propagation energy, strip-like passage heat propagation and diffusion energy, solar radiation energy, the geothermal energy distribution below the urban stratum, etc., are fully taken into account. The present invention solves the problems in which inverse detection and positioning cannot be effectively performed on an urban strip-like passage because a signal thereof in an infrared image is weakened after being conducted and modulated by the stratum, thereby implementing inverse detection and positioning of a strip-like passage.

The present invention takes into account specific urban topographic and geological conditions and urban street surface solar radiation energy, and fully takes into account the effect of direct solar radiation and diffuse solar radiation in each DEM data grid. Compared with the method of using a multi-temporal infrared image to analyze a pattern of change in an underground passage/pipeline signal with time and establishing a mathematical model to calculate the location of a strip-like underground passage, the present invention more precisely takes into account effects of an external environment and geological conditions of an urban stratum on disturbance of energy of an underground strip-like passage target, so that a detection inversion result is more precise. In addition, the method of performing statistical analysis on an urban infrared image is used to identify a signature pattern of formation of a stratum having a strip-like passage/pipeline and a nearby stratum having no strip-like passage/pipeline, and to search for the signature pattern by traversing, in a certain direction, an infrared image of an urban stratum environment in which a strip-like underground passage/pipeline may be contained, thereby detecting and positioning an urban underground strip-like passage target. However, the located features may result from differences in geological conditions, thereby resulting in erroneous determination. The present invention takes into account the effects of geological conditions of different urban strata, and a constructed urban hierarchical three-dimensional temperature field model is more consistent with actual conditions. Urban stratum heat flux is calculated via the urban hierarchical three-dimensional temperature field model, so that stratum background heat flux is more accurately filtered out, and the accuracy of inverse detection and positioning of a strip-like underground passage is higher.

DETAILED DESCRIPTION

To make the purpose, technical solution, and advantages of the present invention clearer, the present invention is further described in detail below in connection with the accompanying drawings and embodiments. It should be appreciated that the specific embodiments described here are used merely to explain the present invention and are not used to define the present invention.

The general idea of the present invention is as follows: for an urban environment, after solar radiation interference is filtered out from actual infrared radiation of an urban street surface acquired by using an infrared remote sensing image, urban underground geological background heat flux of different thicknesses is sequentially filtered out layer by layer, so that urban strip-like underground target information is effectively protected, and accurate strip-like underground target perturbation signal distribution is acquired, thereby achieving detection and positioning of an urban strip-like underground target.

Figure 1:
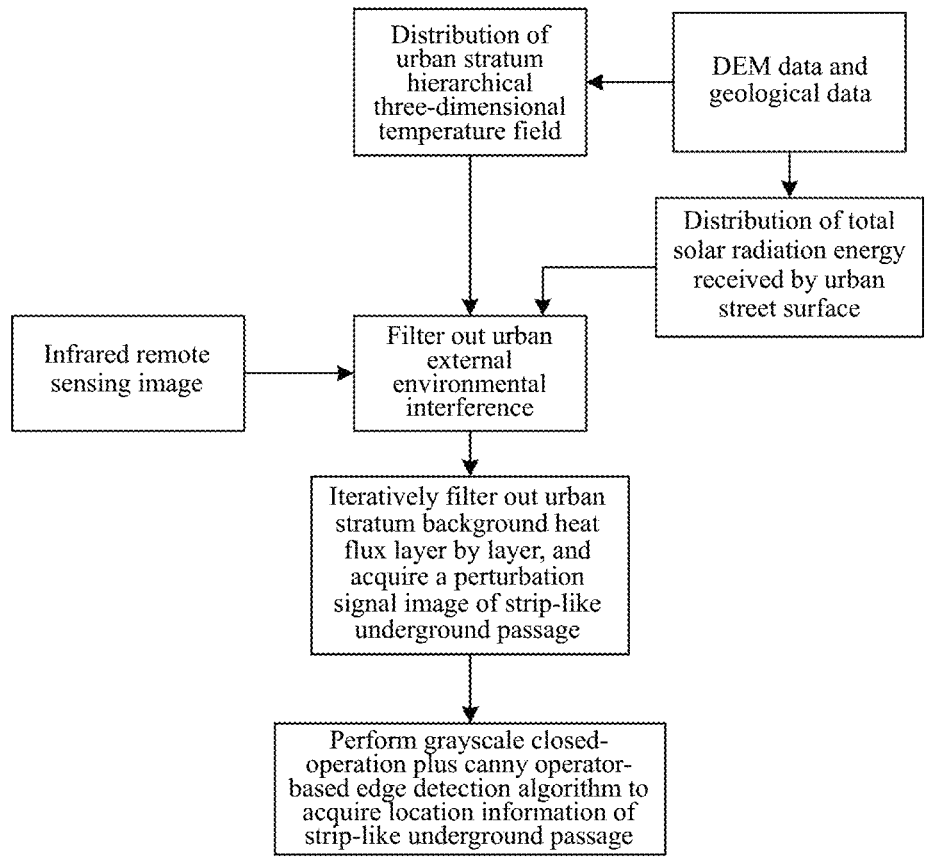
FIG. 1 is a flowchart of an infrared imaging detection method for an urban street underground passage according to an embodiment of the present invention.

As shown in FIG. 1, in an aspect, provided in the present invention is a geologically constrained infrared imaging detection method for an urban street deeply-buried strip-like passage, specifically including the steps of:

(1) establishing an urban hierarchical three-dimensional temperature field model according to urban street DEM data and public urban geological knowledge and data, wherein an urban hierarchical three-dimensional temperature field is divided into two three-dimensional temperature fields, one being a three-dimensional temperature field of concrete material covering urban surface roads, and the other being a three-dimensional temperature field of urban street subterranean strata;

(2) acquiring urban stratum geological background heat flux according to the urban hierarchical three-dimensional temperature field model, and using a total solar radiation energy distribution model to calculate urban surface total solar radiation energy on the basis of the DEM data;

(3) filtering out the urban surface total solar radiation energy from an infrared remote sensing image of a region corresponding to a strip-like underground target;

(4) filtering out, layer by layer with reference to the DEM data, the urban stratum geological background heat flux from the infrared remote sensing image processed in step (3), to acquire a perturbation signal image of an urban street deeply-buried strip-like passage; and (5) using, according to temporal and spatial continuity of heat transfer, a rectangular structure element to perform grayscale closed-operation processing on the perturbation signal image for detection, and restoring a discontinuous perturbation signal, thereby improving the continuity of the perturbation signal of the strip-like passage;

(6) performing binarization processing on the perturbation signal image having undergone the grayscale closed-operation processing, and using a canny operator-based edge detection algorithm to acquire edge information of a strip-like passage;

(7) filling a connected region in an image acquired via the processing performed in step (6), wherein a resultant image acquired after corrosion has been performed in a perpendicular direction is detection and positioning information of the urban street deeply-buried strip-like passage;

(8) performing inverse detection and positioning on the resultant image acquired by means of the corrosion, to determine location information of a strip-like underground passage.

In another aspect, provided in the present invention is a geologically constrained infrared imaging detection system for an urban street deeply-buried strip-like passage, including:

an urban hierarchical three-dimensional temperature field model establishing module, for establishing an urban hierarchical three-dimensional temperature field model according to urban street DEM data and geological data corresponding to urban streets,
wherein the urban hierarchical three-dimensional temperature field model includes a three-dimensional temperature field model of concrete material covering urban surface roads and a three-dimensional temperature field model of urban street subterranean strata;
a total solar radiation energy calculating module, for using a total solar radiation energy distribution model to calculate urban surface total solar radiation energy on the basis of the DEM data;
an urban stratum geological background heat flux calculating module, for calculating urban stratum geological background heat flux via the urban hierarchical three-dimensional temperature field model;
an image filtering module, for filtering out the urban surface total solar radiation energy from an infrared remote sensing image of a region corresponding to a strip-like underground target, and filtering out, layer by layer with reference to the DEM data, the urban stratum geological background heat flux from the infrared remote sensing image from which the urban surface total solar radiation energy has been filtered out, so as to acquire a perturbation signal image of an urban street deeply-buried strip-like passage; and
a perturbation signal processing module, for using an inverse detection and positioning method to acquire location information of the strip-like underground passage after preprocessing the perturbation signal image of a urban street deeply-buried strip-like passage;
wherein the urban hierarchical three-dimensional temperature field model is constructed on the basis of geometric characteristics of a strip-like underground strip, urban underground background thermal radiation characteristics, and thermal radiation characteristics of the strip-like underground passage, and the total solar radiation energy distribution model is constructed via distribution of direct solar radiation and distribution of diffuse solar radiation.

Further preferably, the perturbation signal processing module includes a perturbation signal preprocessing unit and an inverse detection unit,
the perturbation signal preprocessing unit includes: a grayscale closed-operation processor, an edge detector, and a filling device,
the grayscale closed-operation processor uses, according to temporal and spatial continuity of heat transfer, a rectangular structure element to perform grayscale closed-operation processing on the perturbation signal image for detection, and restores a discontinuous perturbation signal,
the edge detector performs binarization processing on the perturbation signal image having undergone the grayscale closed-operation processing, and uses a canny operator-based edge detection method to acquire edge information of a strip-like passage,
the filling device is used to fill a connected region in an image acquired via the processing performed the edge detector, and
the inverse detection unit is used to perform corrosion in a perpendicular direction of the filled image, and perform inverse detection and positioning on an image acquired by means of the corrosion, and determine location information of a strip-like underground passage.

Further preferably, a method for acquiring the distribution of direct solar radiation includes:

multiplying solar radiation received by an upper boundary of the atmosphere, an atmospheric transmissivity of direct solar radiation, and a sine function of a solar elevation angle, to acquire the distribution of direct solar radiation, and a method for acquiring the distribution of diffuse solar radiation includes:

calculating a hemispherical viewshed according to each grid of the DEM data;

dividing the hemispherical viewshed into several sectors with reference to the hemispherical viewshed in combination with the sun position and sky information;

dividing each of the several sectors into several regions, respectively calculating diffuse solar radiation amounts in the several regions, and adding the same to acquire a diffuse solar radiation amount of the entire sector; and adding the diffuse solar radiation amounts of all of the sectors corresponding to all of the grids to acquire the distribution of diffuse solar radiation.

Further preferably, a method for establishing the urban hierarchical three-dimensional temperature field model including the steps of:

constructing an urban underground strip-like target thermal energy radiation hierarchical model by means of COMSOL finite element simulation software, with reference to urban DEM data and the geological data corresponding to the urban streets, and according to heat conservation in a heat transfer process of an urban street/underground strip-like passage coupling model, an underground strip-like passage surface boundary condition, a heat balance equation for a contact surface between an underground strip-like passage outer surface and the urban streets, and a heat conductivity of the underground strip-like passage after introduction of an underground strip-like passage shape factor, wherein layers of the urban underground strip-like target thermal energy radiation hierarchical model include an urban street covering concrete material layer, but does not include a stratum of the strip-like underground passage; and constructing the urban hierarchical three-dimensional temperature field model in correspondence with geological data of different areas and by combining the urban underground strip-like target thermal energy radiation hierarchical model and the DEM data.

Example 1

A first subway of a certain city is used as an example for description. This example provides a geologically constrained infrared imaging detection method for the first subway passage of the certain city, including the steps of:

(1) acquiring a visible light/infrared remote sensing image including the first subway of the certain city and DEM data of a corresponding region; and (2) with reference to geology of an urban area of the certain city, constructing an urban stratum background hierarchical three-dimensional temperature field model.

Guided by the basic theories of disciplines such as geophysics, heat transfer science, remote sensing technology, etc., the substance/energy characteristic relationship and the pattern of interaction between an underground strip-like passage of a street of the urban area of the certain city and an environment of the same were analyzed, and an urban stratum geological background heat flux model was studied and established.

Specifically:

(2.1) Constructing an urban stratum background hierarchical three-dimensional temperature field model.

Theoretical research was performed on the relationship between the heat-transfer characteristic of the underground strip-like passage of the certain city and the urban environment of the urban area of the certain city. With reference to the DEM data of the area of the first subway of the certain city, the public geological knowledge of the certain city was queried. The temperature distribution of the stratum of the urban area of the certain city was learned. The hierarchical modeling and simulation was performed on the urban street stratum background by using existing finite element simulation software.

With reference to the found relevant geological data of the flat area of the certain city, the simulation model was divided into two layers. The upper layer was 5 m, and was the building material concrete (cellular concrete). The lower layer was 5 m to 50 m, and the material was soil. The hierarchical simulation model was more consistent with the actual propagation of the thermal radiation.

The public geological data shows that the shallow ground temperature of the flat area of the certain city is 14.5° C. to 16.5° C. except that the ground temperature of some areas that are abnormal in ground temperature is slightly higher (20 plus degrees Celsius). The shallow ground temperature refers to the geothermal energy that is contained in the rock and earth mass and the underground water within a certain depth range (typically 200 m) below the ground and that is worth exploitation and utilization. The shallow geothermal energy is a form of thermal energy, is part of geothermal resources, has the temperature that is slightly higher than the local annual average temperature by 2° C. to 3° C. and that is relatively constant, and is stored in the underground rock (the soil layer) and the water body in rock fractures or the pores in the soil layer, and some low-grade geothermal resources thereof can be utilized by means of hydrothermal exchange to perform heating or air conditioning.

The shallow geothermal energy distribution is not only controlled by the geological structure, but is also closely linked to the structure of the quaternary strata, the lithology, and the underground water runoff condition. The quaternary strata are storage media of the shallow geothermal energy resources. The stratigraphic structure controls the distribution of the shallow geothermal energy resources. The 70 m shallow ground temperature anomaly distribution diagram of the flat area of the certain city was acquired by means of queries.

It can be seen from the ground temperature anomaly distribution diagram that the ground temperature field distribution and the ground temperature change of the certain city are obviously linked to the geological structure, and the shallow ground temperature is between 14.5° C. and 16.5° C. except that the shallow ground temperature of some areas that are abnormal in ground temperature is slightly higher (20 plus degrees Celsius). The shallow geothermal energy refers to the geothermal energy that is contained in the rock and earth mass and the underground water within a certain depth range (typically 200 m) below the ground and that is worth exploitation and utilization. The shallow geothermal energy is a form of thermal energy, and is part of geothermal resources. It can be seen from the 70 m shallow ground temperature anomaly distribution diagram of the flat area of the certain city that the urban area of the certain city is in the area where the ground temperature at the depth of 70 m is greater than 15° C. Therefore, this simulation set the bottom layer temperature to 15° C.

To display the stratum background heat transfer information of the strip-like subway, the COMSOL finite element simulation software was used to simulate and calculate the urban street stratum background hierarchical three-dimensional temperature field distribution.

(2.1.1) Heat conservation in a heat transfer process in an urban street/underground strip-like passage coupling model may be described as:

$$Q_d + Q_v = Q$$

$$Q_v = \rho C_\rho w \cdot \nabla T$$

$$Q_d = -k \cdot h \cdot \nabla T$$

where $Q_v$ and $Q_d$ respectively represent convective heat flux and conduction heat flux, Q representing heat flux inputted from the outside, $\rho$ and $C_\rho$ respectively representing medium density and a constant-pressure specific heat capacity, w representing a fluid velocity, k representing a thermal conductivity of the medium, h representing an altitude gradient, $\nabla T$ representing a gradient change in temperature in a vertical direction, where difference approximation may be employed in calculation, $$\nabla T = \frac{\partial T}{\partial z} \approx \frac{\Delta T}{\Delta z}.$$

The medium herein is a medium contained in an urban subway tunnel.

(2.1.2) The subway passage surface boundary condition is that the temperature in the urban subway passage is constant, and can be expressed as:

$$T_{in} = f(y) = T_0$$

where f(*) is the distribution function of the temperature in the passage, y being the passage length, and $T_0$ being the constant temperature in the passage.

(2.1.3) For a contact surface between the outer surface of the subway passage and the urban stratum, the following thermal balance relationship is present:

$$\frac{\lambda_c (T_{out} - T_{in})}{\delta_c} = \frac{\lambda_g (T_s - T_{out})}{\delta_g}$$

where $T_{out}$ and $T_{in}$ respectively represent the temperature of the outer surface of the subway passage and the temperature in the subway passage, $T_s$, representing the surface temperature of the urban street, $\lambda_c$ and $\delta_c$ respectively representing the thickness and the thermal conductivity coefficient of concrete between the inner surface and the outer surface of the subway passage, and $\lambda_g$ and $\delta_g$ respectively representing the thickness and the thermal conductivity coefficient of granite between the outer surface of the subway passage and the ground.

(2.1.4) The longitudinal length of the subway passage is much greater than the cross-sectional radius thereof, and the calculation process may be simplified by introducing a shape factor. After the shape factor is introduced, the amount of conducted heat is calculated as follows:

$$\Phi = \lambda S (T_1 - T_2)$$

$$S = \frac{2\pi / \ln\left(\frac{2l}{d}\right)}{1 + \frac{\ln(2H/l)}{\ln(2H/d)}}$$

where $\Phi$ is the amount of heat conducted by the subway passage, $\lambda$ being the thermal conductivity coefficient of the material of the medium between isothermal surfaces, $T_1$ being the amount of heat conducted by the upper surface, $T_2$ being the amount of heat conducted by the lower surface, d and l respectively representing the cross-sectional radius and the overall length of the subway passage, and H representing a burial depth of the first subway.

The surface temperature field distribution of the subway passage coupling model of the urban area of the certain city can be acquired by calculating (2.1.1) to (2.1.4) in a combined manner. In the example, modeling, simulation, and calculation were performed with reference to the relevant parameters by using COMSOL finite element simulation software, thereby acquiring the ultimate stratum background hierarchical three-dimensional temperature field distribution of the area of the first subway of the certain city.

(2.2) Urban stratum geological background heat flux model

Ideally, a calculation formula of the heat flux per unit area is as follows:

$$HF = c_m k \frac{\partial T}{\partial h}$$

where $C_m$ is a volumetric heat capacity of a rock stratum medium, k being thermal conductivity of the rock stratum medium, and $$\frac{\partial T}{\partial h}$$

being a vertical temperature gradient, which can be calculated by means of difference approximation, where the temperature gradient needs to be calculated by using the stratum background hierarchical three-dimensional temperature field, and it can be seen that the temperature gradient and the stratum background hierarchical three-dimensional temperature field have a substantially linear relationship therebetween.

In the process of hierarchical filtering out the geological background heat flux, energy contained in stratum backgrounds of different thicknesses needs to be calculated with reference to stratum background heat flow field energy distribution:

$$E(x,y,t) = \int_{z1(x,y)}^{z2(x,y)} HF(x,y,z,t) \cdot A(z) \cdot \varepsilon(z) dz$$

where A(z) and $\varepsilon$(z) are respectively a cross-sectional area and a heat flow attenuation coefficient at a certain elevation in the stratum, z1(x, y) and z2(x, y) being respectively urban stratum surface elevation coordinates and elevation coordinates at a certain depth below the surface, and z2(x, y) being adjusted to calculate the heat flow field energy contained in the stratum backgrounds of different thicknesses. The above formulas are the equations of the urban stratum geological background heat flux model.

(3) Filtering out the urban surface total solar radiation energy from an infrared remote sensing image of a region corresponding to an urban street deeply-buried strip-like passage.

The infrared image used in this example was captured at 3 p.m. on Sep. 28, 2012. The solar radiation greatly interferes with detection of the urban street deeply-buried strip-like passage, and the urban street surface temperature data acquired by means of modeling, simulation, and calculation in the process of strip-like passage heat flow field analysis and modeling was theoretical data in an ideal situation without taking the effect of the external environment into account, and was different from actual infrared radiation data of the urban ground surface acquired by means of an infrared remote sensing image. Therefore, when the interference factors of the area of the first subway of the certain city are taken into account, two major external interference factors, i.e., solar radiation and street stratum background thermal radiation energy, need to be investigated, calculated, and eliminated, so as to ensure the authenticity and effectiveness of a detection result.

Figure 2:
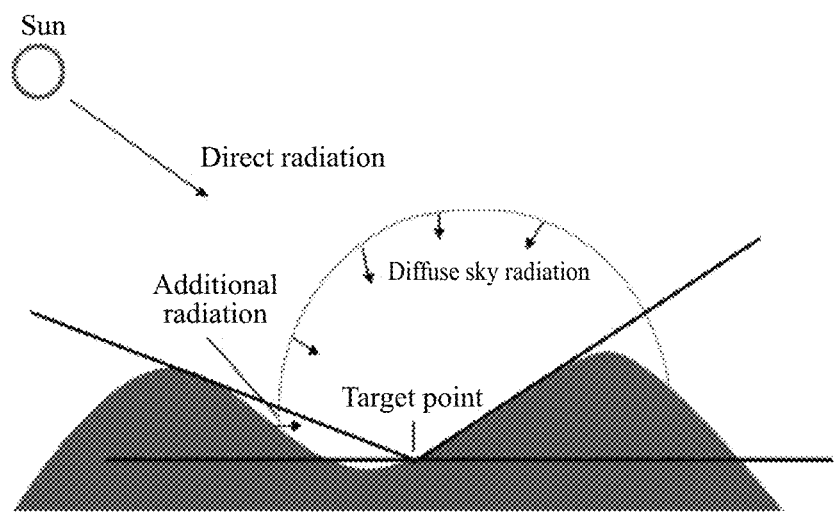
FIG. 2 is a schematic diagram of solar radiation received at a certain point according to an embodiment of the present invention.

The solar radiation received by the ground mainly includes direct radiation, diffuse radiation, and reflected radiation. Since the reflected radiation accounts for a small portion, and has an obvious effect on the solar radiation received by the ground only under special conditions, typically, a solar radiation calculation model does not take the reflected radiation into account. The solar radiation received at a certain point on the ground is shown in FIG. 2.

(3.1) Calculating distribution of direct solar radiation:

A calculation formula of the direct solar radiation $E_{bh}$ at a certain point on the ground in sunny days without clouds is as follows:

$$E_{bh}=E_0 \times \tau_b \times \sin h$$

where $E_0$ is solar radiation received by the upper boundary of the atmosphere.

$$E_0=E_{sc} \times [1+0.034 \times \cos(2\pi n/365)]$$

where $E_{sc}$ is the solar constant, and a reference value announced by the World Meteorological Organization (WHO) is 1367 W/m², n being the number of days between the calculation day and January 1.

$\tau_b$ is an atmospheric transmissivity of direct solar radiation, and specifically:

$$\tau_b=0.56 \times (e^{-0.56m(h)}+e^{-0.096m(h)}) \times k_1$$

where h is the solar elevation angle, and is provided in acquired infrared image information, the parameter m being mass of the atmosphere, and the parameter $k_1$ being an empirical value, and being typically 0.8 to 0.9.

$$m(h) = \begin{cases} 1/\sin h, & h \geq 30° \\ [1229+(614 \times \sin h)^2]^{1/2} - 614 \times \sin h, & h < 30° \end{cases}$$

The direct solar radiation of the area of the first subway of the certain city was acquired.

(3.2) Calculating diffuse solar radiation received by the ground:

With reference to the method for calculating the hemispherical viewshed, the hemispherical viewshed distribution of the diffuse solar radiation was calculated to acquire the diffuse solar radiation received by the urban street surface. The hemispherical viewshed can be understood as an unblocked region within a range in the sky looked up at from a certain position. The viewshed is defined as follows: identifying DEM data, and performing calculation to acquire an image element position capable of being seen at a certain observation position on a DEM; in an algorithm for calculating the viewshed, defining an output as visibility at the position, that is, whether a target position can be directly seen at the observation position, and using a binary image to indicate visibility, wherein positions that can be seen directly are set to 1, and the other positions are set to 0.

The center point of a DEM image of the area of the first subway of the certain city was used as an example:

To calculate the diffuse solar radiation, first, for an observation position, a hemispherical viewshed of looking up to the sky was established for this position, and the diffuse radiation distribution in this hemispherical viewshed was established. Meanwhile, the hemispherical viewshed was divided into a plurality of sectors. When the sector acquired from division was sufficiently small, the diffuse solar radiation within the sector can be regarded to be the same. In this example, the sector division angle was set to 5°, and each sector was divided into 100 small regions according to the radius. The acquired viewsheds of specific position points of which the diffuse radiation needs to be calculated were superimposed, thereby acquiring the distribution of the diffuse solar radiation capable of being received at the position.

The diffuse radiation in the visible range of the viewshed was accumulatively added, thereby acquiring the total diffuse radiation at the observation position. The above operation was sequentially performed on all positions in the area of the first subway of the certain city, thereby acquiring the diffuse radiation distribution of the area of the first subway of the certain city.

The sum of the direct solar radiation energy and the diffuse solar radiation energy received by the ground was acquired, and the distribution of the total solar radiation energy received by the ground in the area of the first subway of the certain city was acquired.

(4) Filtering out, layer by layer with reference to the DEM data, the urban stratum geological background heat flux from the infrared sensing image processed in step (3), to acquire a perturbation signal image of an urban street deeply-buried strip-like passage; and Because the pattern of heat transfer of the strip-like passage in the stratum under the urban street is in accordance with a mathematical model of thermal conduction, the temperature field distribution of the street stratum of the certain city and the temperature field distribution of the underground strip-like passage can be acquired according to the heat transfer theorem and pattern, and then the heat flow field distribution being a combination thereof can be calculated. Since the model of thermal radiation between the radiation surface of the urban street surface and the air layer is a three-dimensional structure, the formula of distribution of the energy field also needs to be expressed in a three-dimensional form. It is assumed that the radiation energy at the urban street surface $(x_0, y_0, z_0)$ at a certain time to is $BT(x_0, y_0, z_0, t)$. According to the energy conservation law, the value of the radiation energy can be calculated according to heat flow field energy of the underground strip-like passage, stratum background heat flow field energy, radiation energy exchanged between the same and the environment, and the received solar radiation energy:

$$BT(x_0,y_0,z_0,t)=B(x,y,z,t)+T(x,y,z,t)+\delta(x,y,z,t)+S(x_0,y_0,z_0,t)-B_m(x,y,z,t)$$

where $BT(x_0, y_0, z_0, t)$ is the urban street surface radiation energy, $B(x, y, z, t)$ being urban street stratum background heat flow field energy, $T(x, y, z, t)$ being underground strip-like passage heat flow field energy, $\delta(x, y, z, t)$ being radiation energy of the contact surface between the urban stratum and the air, $S(x_0, y_0, z_0, t)$ being the solar radiation energy received by the urban street surface, and $B_m(x, y, z, t)$ being the heat flow field energy of the rock stratum in the position corresponding to the underground strip-like passage.

In an actual environment, the radiation energy of the contact surface between the urban stratum and air is very small, and is substantially negligible compared with the heat flow field energy of the stratum and the underground strip-like passage. In the present invention, only the relationship between the stratum background heat flow field energy, the underground strip-like passage heat flow field energy, and the received solar radiation energy is considered.

It can be seen from the above formulas that the heat flow field energy generated by the underground strip-like passage, the urban stratum background heat flow field energy, and the solar radiation energy combine to form the observable urban street surface infrared radiation energy distribution. By transforming the above formula, a calculation formula of underground strip-like passage heat flow field energy can be acquired:

$$T(x,y,z,t) = BT(x_0,y_0,z_0,t) - B(x,y,z,t) - S(x_0,y_0,z_0,t)$$

The heat flow field contained in the rock stratum of each thickness starting from the ground was calculated, and each layer of background heat flux was sequentially removed with reference to the infrared remote sensing image. When some prominent perturbation does not change as the removal thickness increases, the perturbation can be regarded as a perturbation signal of the underground strip-like passage, thereby acquiring location information where the underground strip-like passage is located.

(4.1) Using the urban stratum geological background heat flux model equation:

$$E(x,y,t) = \int_{z1(x,y)}^{z2(x,y)} HF(x,y,z,t) \cdot A(z) \cdot \varepsilon(z) dz$$

to calculate the heat flux contained in the stratum backgrounds of different thicknesses.

(4.2) Filtering out the heat flux of the geological background of the underground strip-like passage layer by layer.

As the heat in the urban stratum is conducted in the rock stratum, a directional heat flow is generated. Similar to the penetration of X-rays, the heat flow at the bottom of the stratum can "penetrate" the rock stratum to reach the surface of the underground strip-like passage, thereby forming a vector heat flow field. Due to different geological conditions, the heat flow transmitting in different rock strata is subjected to different levels of attenuation. In addition, a certain relationship is present between the heat flow field and the internal temperature field of the stratum, and may be substantially a linear relationship. The infrared radiation of the urban street surface acquired from an infrared remote sensing image can be considered to be a combination of heat flow of all layers of the rock mass.

The stratum thermal field distribution at the same elevation is substantially the same. Similarly, according to the distribution of the subterranean strata, it can be considered that the heat flow field is also the same. Each layer of heat flow field energy is calculated, and the stratum heat flow field energy of different thicknesses is sequentially filtered out by using the actual infrared radiation of the urban street surface acquired by means of the infrared remote sensing image, thereby effectively protecting underground strip-like passage information, and acquiring underground strip-like passage perturbation signal distribution that is relatively more accurate.

The highest elevation of the area of the first subway of the certain city was 78 m, and division was performed at a vertical interval of 5 m, so as to remove background energy layer by layer in a downward direction. Layering was performed downwards continuously to acquire the strip-like passage perturbation signal distribution diagram after the stratum background heat flux at the depths of 5 m, 10 m, 15 m, 20 m, 25 m, and 30 m was filtered out.

Figure 3:
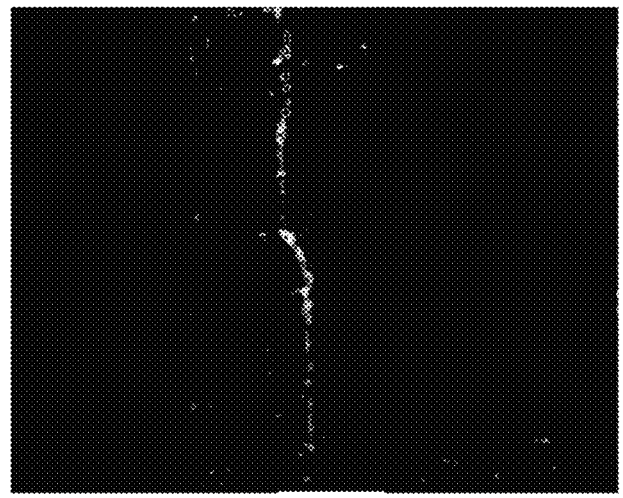
FIG. 3 is a resultant image of perturbation signal detection according to an embodiment of the present invention.

In the detection and positioning process, when the removal of the background energy reached the burial depth of 30 m, the disturbance of the underground strip-like passage had been substantially completely acquired, and when the removal of the background energy reached 40 m, it could be seen that the change in the disturbance image was extremely small. Compared with the detection inversion positioning result of the previous height layer, almost nothing had changed in the range of the disturbance region. At this point, the added part was mainly the interference in the region within the height layer of 30 m to 40 m. The above test proved that such interference would be progressively mitigated in the layer-by-layer detection and positioning process. The strong interference such as the buildings, etc., on the urban street surface were further filtered out according to the infrared image, and the perturbation resultant image of the first subway passage of the certain city was acquired, as shown in FIG. 3.

(5) Processing the detected perturbation signal, which was obviously a strip-like distribution in a north-south direction, by means of grayscale closed-operation, and using a rectangular structure element to restore a discontinuous perturbation signal, thereby improving the continuity of the perturbation signal of the strip-like passage.

The grayscale closed-operation was performed on the perturbation signal. It could be seen from the image of the above detected perturbation signal that the underground deeply-buried passage was in a north-south direction, so that a 7×2 rectangular structure element was used to perform the grayscale closed-operation.

Figure 4:
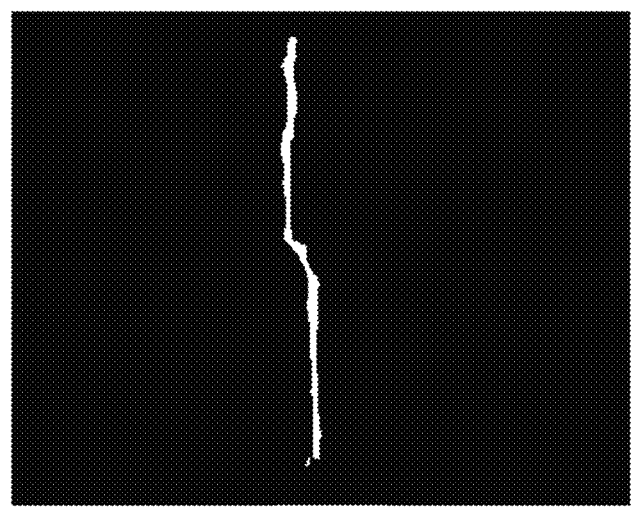
FIG. 4 is a resultant image of detection and positioning of a first subway of a certain city according to an embodiment of the present invention.

An edge detection resultant image was subjected to region filling. After filling, corrosion was performed to acquire a detection and positioning result of the first subway of the certain city, as shown in FIG. 4.

With reference to the priori knowledge such as the visible light image, etc., the actual location of the first subway of the certain city was marked on an infrared image, and the detection and positioning result was marked and displayed on the infrared image. According to the comparison between the detected position and the actual location, the detection and positioning result of the first subway of the certain city is consistent with the direction of the actual location of the first subway, thereby acquiring the accurate location information of the first subway of the certain city.

Example 2

A second subway of a certain city is used as an example for description. This example provides a geologically constrained infrared imaging detection method for the second subway passage of the certain city, including the steps of:

(1) acquiring a visible light/infrared remote sensing image including the second subway of the certain city and DEM data of a corresponding region; and (2) with reference to geology of the certain city, constructing an urban stratum background hierarchical three-dimensional temperature field model.

Theoretical research was performed on the relationship between the heat-transfer characteristic of the underground strip-like passage of the certain city and the urban environment of the urban area of the certain city. With reference to the DEM data of the area of the second subway of the certain city, the public geological knowledge of the certain city was queried. The temperature distribution of the stratum of the urban area of the certain city was learned. The hierarchical modeling and simulation was performed on the urban street stratum background by using existing finite element simulation software.

With reference to the found relevant geological data of the flat area of the certain city, the simulation model was divided into two layers. The upper layer was 3 m, and was the building material concrete (cellular concrete). The lower layer was 3 m to 50 m, and the material was soil. The simulation model was more in line with the actual condition.

To display the stratum background heat transfer information of the strip-like subway, modeling, simulation, and calculation were performed with reference to the relevant parameters by using COMSOL finite element simulation software, thereby acquiring the ultimate stratum background hierarchical three-dimensional temperature field distribution of the area of the second subway of the certain city, as shown in FIG. 8.

(3) Filtering out the urban surface total solar radiation energy from an infrared remote sensing image of a region corresponding to an urban street deeply-buried strip-like passage.

The infrared image used in this example was captured at 3 p.m. on Sep. 28, 2012. The solar radiation greatly interferes with detection of the urban street deeply-buried strip-like passage, and the urban street surface temperature data acquired by means of modeling, simulation, and calculation in the process of strip-like passage heat flow field analysis and modeling was theoretical data in an ideal situation without taking the effect of the external environment into account, and was different from actual infrared radiation data of the urban ground surface acquired by means of an infrared remote sensing image. Therefore, when the interference factors of the area of the second subway of the certain city are taken into account, two major external interference factors, i.e., solar radiation and street stratum background thermal radiation energy, need to be investigated, calculated, and eliminated, so as to ensure authenticity and effectiveness of a detection result.

The solar radiation received by the ground mainly includes direct radiation, diffuse radiation, and reflected radiation. Since the reflected radiation accounts for a small portion, and has an obvious effect on the solar radiation received by the ground only under special conditions, typically, a solar radiation calculation model does not take the reflected radiation into account.

(3.1) Calculating distribution of direct solar radiation.

The direct solar radiation of the area of the second subway of the certain city was acquired.

(3.2) Calculating diffuse solar radiation received by the ground.

With reference to the method for calculating the hemispherical viewshed, the hemispherical viewshed distribution of the diffuse solar radiation was calculated to acquire the diffuse solar radiation received by the urban street surface. The hemispherical viewshed can be understood as an unblocked region within a range in the sky looked up at from a certain position. The viewshed is defined as follows: identifying DEM data, and performing calculation to acquire an image element position capable of being seen at a certain observation position on a DEM; in an algorithm for calculating the viewshed, defining an output as visibility at the position, that is, whether a target position can be directly seen at the observation position, and using a binary image to indicate visibility, wherein positions that can be seen directly are set to 1, and the other positions are set to 0.

To calculate the diffuse solar radiation, first, for an observation position, a hemispherical viewshed of looking up to the sky was established for this position, and the diffuse radiation distribution in this hemispherical viewshed was established. Meanwhile, the hemispherical viewshed was divided into a plurality of sectors. When the sector acquired from division was sufficiently small, the diffuse solar radiation within the sector can be regarded to be the same. In this example, the sector division angle was set to 5°, and each sector was divided into 100 small regions according to the radius. The acquired viewsheds of specific position points of which the diffuse radiation needs to be calculated were superimposed, thereby acquiring the distribution of the diffuse solar radiation capable of being received at the position.

The diffuse radiation in the visible range of the viewshed was accumulatively added, thereby acquiring the total diffuse radiation at the observation position. The above operation was sequentially performed on all positions in the area of the second subway of the certain city, thereby acquiring the diffuse radiation distribution of the area of the second subway of the certain city.

The sum of the direct solar radiation energy and the diffuse solar radiation energy received by the ground was acquired, and the distribution of the total solar radiation energy received by the ground in the area of the second subway of the certain city was acquired.

(4) Filtering out, layer by layer with reference to the DEM data, the urban stratum geological background heat flux from the infrared sensing image processed in step (3), to acquire a perturbation signal image of an urban street deeply-buried strip-like passage; and The highest elevation of the area of the second subway of the certain city was 70 m, and division was performed at a vertical interval of 5 m, so as to remove background energy layer by layer in a downward direction. Layering was performed downwards continuously to acquire the strip-like passage perturbation signal distribution diagram after the stratum background heat flux at the depths of 5 m, 10 m, 15 m, 20 m, 25 m, and 30 m was filtered out.

Figure 5:
FIG. 5 is a resultant image of perturbation signal detection for a second subway of a certain city according to an embodiment of the present invention.

In the detection and positioning process, when the removal of the background energy reached the burial depth of 30 m, the disturbance of the underground strip-like passage had been substantially completely acquired, and when the removal of the background energy reached 40 m, it could be seen that the change in the disturbance image was extremely small. Compared with the detection inversion positioning result of the previous height layer, almost nothing had changed in the range of the disturbance region. At this point, the added part was mainly the interference in the region within the height layer of 30 m to 40 m. The above test proved that such interference would be progressively mitigated in the layer-by-layer detection and positioning process. The strong interference such as the buildings, etc., on the urban street surface were further filtered out according to the infrared image, and the perturbation resultant image of the second subway passage of the certain city was acquired, as shown in FIG. 5.

(5) Processing the detected perturbation signal, which was obviously a strip-like distribution in an east-west direction, by means of grayscale closed-operation, and using a rectangular structure element to restore a discontinuous perturbation signal, thereby improving continuity of the perturbation signal of the strip-like passage.

Figure 6:
FIG. 6 is a resultant image of a grayscale closed-operation for a second subway of a certain city according to an embodiment of the present invention.

The grayscale closed-operation was performed on the perturbation signal. It could be seen from the image of the above detected perturbation signal that the underground deeply-buried passage was in an east-west direction, so that a 2×7 rectangular structure element was used to perform the grayscale closed-operation. The result is shown in FIG. 6, which is a binary image after the gray scale closed-operation.

Figure 7:
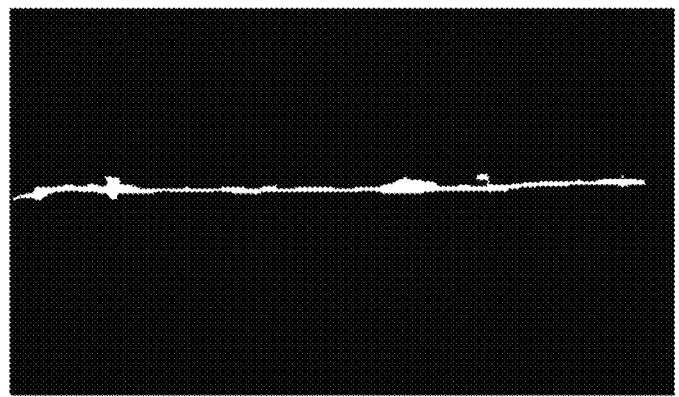
FIG. 7 is a resultant image of detection and positioning of a second subway of a certain city according to an embodiment of the present invention.

An edge detection resultant image was subjected to region filling. After filling, corrosion was performed to acquire a detection and positioning result of the second subway of the certain city, and as shown in FIG. 7, the detection and positioning result was marked on the infrared image.

With reference to the priori knowledge such as the visible light image of the area of the second subway of the certain city, etc., the actual location of the second subway of the certain city was compared with the detected position. The detection and positioning result of the second subway of the certain city is substantially consistent with the direction of the actual location of the second subway, thereby acquiring the accurate location information of the second subway of the certain city.

In conclusion, the present invention has the following advantages as compared to the prior art:

In the present invention, the model of thermal radiation between a stratum in which an urban street deeply-buried strip-like passage is located and an air layer is used in conjunction with DEM data and different geological conditions of the stratum below an urban street to calculate total solar radiation energy of the urban street surface, and iteratively filter out heat flux of the geological background below the urban stratum layer by layer. A strip-like passage heat propagation energy perturbation signal is acquired. The effects of an external environment and internal geological conditions on the urban stratum, such as disturbance differences in infrared data caused by geological factors such as temperature distribution in layers of different thicknesses in a city, stratum heat propagation energy, strip-like passage heat propagation and diffusion energy, solar radiation energy, the geothermal energy distribution below the urban stratum, etc., are fully taken into account. The present invention solves the problems in which inverse detection and positioning cannot be effectively performed on an urban strip-like passage because a signal thereof in an infrared image is weakened after being conducted and modulated by the stratum, thereby implementing inverse detection and positioning of a strip-like passage.

The present invention takes into account specific urban topographic and geological conditions and urban street surface solar radiation energy, and fully takes into account the effect of direct solar radiation and diffuse solar radiation in each DEM data grid. Compared with the method of using a multi-temporal infrared image to analyze a pattern of change in an underground passage/pipeline signal with time and establishing a mathematical model to calculate the location of a strip-like underground passage, the present invention more precisely takes into account effects of an external environment and geological conditions of an urban stratum on disturbance of energy of an underground strip-like passage target, such that a detection inversion result is more precise. In addition, the method of performing statistical analysis on an urban infrared image is used to identify a signature pattern of formation of a stratum having a strip-like passage/pipeline and a nearby stratum having no strip-like passage/pipeline, and to search for the signature pattern by traversing, in a certain direction, an infrared image of an urban stratum environment in which a strip-like underground passage/pipeline may be contained, thereby detecting and positioning an urban underground strip-like passage target. However, the located features may result from differences in the geological conditions, thereby resulting in erroneous determination. The present invention takes into account the effects of geological conditions of different urban strata, and a constructed urban hierarchical three-dimensional temperature field model is more consistent with actual conditions. Urban stratum heat flux is calculated via the urban hierarchical three-dimensional temperature field model, so that stratum background heat flux is more accurately filtered out, and the accuracy of inverse detection and positioning of a strip-like underground passage is higher.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. A geologically constrained infrared imaging detection method for an urban buried strip passage, the method comprising:
    (1) generating an urban hierarchical three-dimensional temperature field model according to urban street digital elevation model (DEM) data and geological data corresponding to urban streets,
    wherein the urban hierarchical three-dimensional temperature field model comprises a three-dimensional temperature field model of concrete material covering urban surface roads and a three-dimensional temperature field model of urban street subterranean strata;
    (2) determining urban stratum geological background heat flux via the urban hierarchical three-dimensional temperature field model, and using a total solar radiation energy distribution model to determine urban surface total solar radiation energy on the basis of the DEM data;
    (3) filtering out the urban surface total solar radiation energy from an infrared remote sensing image of a region corresponding to a strip underground target;
    (4) filtering out, with reference to the DEM data, the urban stratum geological background heat flux from the infrared remote sensing image processed in step (3), to acquire a perturbation signal image of an urban street buried strip passage; and
    (5) performing detecting and positioning using an inverse detection method after preprocessing the perturbation signal image of the urban street buried strip passage, to acquire location information of a strip underground passage;
    wherein the urban hierarchical three-dimensional temperature field model is generated on the basis of geometric characteristics of the strip underground passage, urban stratum background thermal radiation characteristics, and thermal radiation characteristics of the strip underground passage, and the total solar radiation energy distribution model is constructed via distribution of direct solar radiation and distribution of diffuse solar radiation.

2. The infrared imaging detection method for an urban buried strip passage according to claim 1, wherein the preprocessing of the perturbation signal image of the urban street buried strip passage comprises the steps of:
   a. using, according to temporal and spatial continuity of heat transfer, a rectangular structure element to perform grayscale closed-operation processing on the perturbation signal image for detection, and restoring a discontinuous perturbation signal;
   b. performing binarization processing on the perturbation signal image having undergone the grayscale closed-operation processing, and using a canny operator-based edge detection method to acquire edge information of a strip passage; and
   c. filling a connected region in an image acquired via the processing performed in step b.

3. The infrared imaging detection method for an urban buried strip passage according to claim 1, further comprising acquiring the distribution of direct solar radiation and acquiring the distribution of diffuse solar radiation,
   wherein the acquiring of the distribution of direct solar radiation comprises:
   multiplying solar radiation received by an upper boundary of the atmosphere, an atmospheric transmissivity of direct solar radiation, and a sine function of a solar elevation angle, to acquire the distribution of direct solar radiation; and
   wherein the acquiring of the distribution of diffuse solar radiation comprises:
   calculating a hemispherical viewshed according to each grid of the DEM data;
   dividing the hemispherical viewshed into several sectors with reference to the hemispherical viewshed in combination with a sun position and sky information;
   dividing each of the several sectors into several regions, respectively calculating diffuse solar radiation amounts in the several regions, and adding the respectively calculated diffuse solar radiation amounts to acquire a diffuse solar radiation amount of the entire sector; and
   adding diffuse solar radiation amounts of all of the sectors corresponding to all of the grids to acquire the distribution of diffuse solar radiation.

4. The infrared imaging detection method for an urban buried strip passage according to claim 1, wherein the generating of the urban hierarchical three-dimensional temperature field model comprising the steps of:
   constructing an urban underground strip target thermal energy radiation hierarchical model by means of COMSOL finite element simulation software, with reference to the DEM data and the geological data corresponding to the urban streets, and according to heat conservation in a heat transfer process of an urban street/underground strip passage coupling model, an underground strip passage surface boundary condition, a heat balance equation for a contact surface between an underground strip passage outer surface and the urban streets, and a heat conductivity of the underground strip passage after introduction of an underground strip passage shape factor,
   wherein layers of the urban underground strip target thermal energy radiation hierarchical model comprise an urban street covering concrete material layer, but does not comprise a stratum of the strip underground passage; and
   constructing the urban hierarchical three-dimensional temperature field model in correspondence with geological data of different areas and by combining the urban underground strip target thermal energy radiation hierarchical model and the DEM data.

\* \* \* \* \*